United States Patent [19]

Dick et al.

[11] Patent Number: 5,036,299
[45] Date of Patent: Jul. 30, 1991

[54] METHOD AND APPARATUS FOR REDUCING MICROWAVE OSCILLATOR OUTPUT NOISE

[75] Inventors: G. John Dick, Claremont; Jonathan E. Saunders, Costa Mesa, both of Calif.

[73] Assignee: California Institute of Technology, Pasadena, Calif.

[21] Appl. No.: 541,968

[22] Filed: Jun. 22, 1990

[51] Int. Cl.⁵ .............................................. H03L 7/00
[52] U.S. Cl. ...................................... 331/25; 331/135
[58] Field of Search ...................... 331/16, 23, 25, 96, 331/135, 136

[56] References Cited

U.S. PATENT DOCUMENTS

| | | | |
|---|---|---|---|
| 3,577,099 | 5/1971 | Hall et al. | 331/135 X |
| 3,614,649 | 10/1971 | Gerig | 331/135 X |
| 4,916,412 | 4/1990 | Nordholt et al. | 331/135 X |

Primary Examiner—Robert J. Pascal
Attorney, Agent, or Firm—Elliott N. Kramsky

[57] ABSTRACT

Microwave oscilltors incorporate r.f. feedback with carrier suppression to reduce phase noise. In a direct feedback oscillator arrngement a circulator is interposed between the r.f. amplifier and the high-Q resonator. The amplifier output is applied to the slightly overcoupled input port of the resonator so that the resultant net return signal is the vectorial difference between the signals emitted and reflected from the resonator. The gain of the r.f. amplifier is chosen to regenerate the forward signal from the net return signal. In a STALO-type arrangement, the resonator is critically coupled and an r.f. amplifier added to the path of the net return signal. The sensitivity of the STALO-type feedback loop is thereby enhanced while added amplifier noise is minimized by the superposition of the signals emitted by and reflected from the resonator.

29 Claims, 8 Drawing Sheets

METHOD AND APPARATUS FOR REDUCING MICROWAVE OSCILLATOR OUTPUT NOISE

The invention described herein was made in the performance of work under a NASA contract, and is subject to the provisions of Public Law 96-517 (35 U.S.C. 202) in which the contractor has elected to retain title.

BACKGROUND OF THE INVENTION

The present invention relates to microwave oscillators. More particularly, this invention pertains to a method and an apparatus for reducing the phase or frequency noise that is observed in the output of a microwave oscillator at frequencies very close to the carrier frequency.

So-called "close-in" phase noise in microwave oscillators results from the conversion of phase fluctuations in the active device or phase detector to frequency fluctuations in the oscillator output. This noise is known to result from feedback mechanisms that are inherent in oscillator operation.

Both the transistors used in oscillators with direct r.f. feedback and the mixers used in stabilized local oscillator (STALO) configurations are characterized by $1/f$ spectral density for phase fluctuations. (The oscillation loop converts $1/f$ phase noise into $1/f$ frequency noise that is mathematically equivalent to $1/f^3$ phase noise.) This $1/f$ noise dominates the oscillator's close-in (f less than approximately 10 kHz) phase noise performance. The magnitude of the $1/f$ phase noise can be reduced by reducing the $1/f$ phase noise of the active device or by increasing the Q of the stabilizing resonator.

A number of technologies that rely upon low frequency oscillators are currently employed to reduce microwave phase noise at all offset frequencies. High stability can be attained for small offsets (f less than 100 Hz) by locking the oscillator to a harmonic of a low frequency (5 MHz) quartz bulk acoustic wave (BAW) crystal oscillator. Further stabilization may be provided by a SAW oscillator operating at about 500 MHz for offset frequencies in the 100 Hz < f < 10 kHz range. The microwave oscillator itself typically provides the best possible stability only for the relatively large offset frequencies (f greater than or equal to 10 kHz). The improved phase noise performance that can be obtained from BAW and surface acoustic wave (SAW) oscillators follows from the fact that, while BAW and SAW quartz crystals exhibit Q values of $10^6$ and $10^5$, respectively, microwave cavities and dielectric resonators are limited to about $1-3 \times 10^4$. Similarly, active devices available at the lower operating frequencies of the quartz devices exhibit $1/f$ phase noise of $-140$ db/Hz and less at an offset frequency of f=1 Hz while the best X-band amplifiers have a larger noise of $-120$ db.

Due to the shortcomings of the prior art arrangements for stabilizing microwave oscillators at close-in frequency fluctuations, extremely high-Q resonators are often required to obtain satisfactory performance. Accordingly, the oscillator expense can be effectively dictated by the type of resonator "demanded". For example, if a microwave sapphire resonator (Q of 100,000 or more) is required by the noise constraints placed upon a microwave oscillator as opposed to either a cavity resonator (Q of approximately 10–30,000) or a dielectric resonator oscillator (DRO; Q up to 10,000), a one hundred (100) times cost increment in the resulting device can occur at present-day prices. Thus active device noise effectively dictates the cost of present day microwave oscillators through its effect upon resonator performance.

STATEMENT OF THE INVENTION

The present invention addresses the close-in noise problem of microwave oscillators without the use of an extremely high-Q resonator by providing, in a first aspect, a method for reducing noise in the output of a tunable microwave oscillator of the type that includes a feedback arrangement for providing a corrective signal. Such feedback arrangement includes a resonator for receiving the oscillator output and an active phase detector for detecting fluctuations in the output by comparing the output with the signal emitted by the resonator. The improvement provided by the invention comprises the step of suppressing the carrier of the signal emitted by the resonator prior to applying the suppressed carrier signal to the phase detector.

In a subsidiary aspect, an embodiment of the invention is preferentially configured also to include the amplification of the suppressed carrier signal prior to application to the phase detector.

In a second aspect, the invention provides an improvement in apparatus for reducing noise in the output of a tunable microwave oscillator of the type that includes a feedback arrangement for providing a corrective signal. The feedback arrangement includes a resonator for receiving the oscillator output and an active phase detector for detecting fluctuations in the output by comparing the output with the signal emitted by the resonator. The improvement provided by the invention comprises means for suppressing the carrier of the signal emitted by the resonator. Such means is located between the resonator and the phase detector.

Again, in a more specific subsidiary aspect, means, located between the resonator and the phase detector, is provided for amplifying the suppressed carrier signal.

In a third aspect, the invention provides an improved method for reducing noise in the output of a microwave oscillator of the type that includes a resonator and an r.f. amplifier in a feedback arrangement. The improvement comprises the steps of suppressing the carrier of the signal emitted by the resonator and then amplifying the suppressed carrier signal so that oscillation is achieved at resonance.

In a final aspect, the invention provides apparatus for reducing noise in the output of a microwave oscillator of the type that includes a resonator and an r.f. amplifier in a feedback arrangement. Such apparatus includes means for suppressing the carrier of the signal emitted by the resonator and means for amplifying the suppressed carrier signal so that oscillation is achieved at resonance.

The foregoing features and advantages of the invention will become further apparent from the detailed description that follows. Such description is accompanied by a set of drawing figures. Numerals of the figures corresponding to those of the written description, point to the various features of the invention, like numerals referring to like features throughout both the written description and drawing figures.

DETAILED DESCRIPTION OF THE INVENTION

The invention comprises novel arrangement for improving the noise performance of microwave oscillators of the prior art. In general, the prior art microwave oscillators addressed by the teachings of the present invention include those of the self-excited (direct r.f. feedback) and stabilized local oscillator (STALO) types. In each case, arrangements are provided for introducing r.f. carrier suppression into the oscillator feedback loop. As will be seen, separate analyses directed to the inventive modifications to the self-excited and STALO oscillators demonstrate that frequency and/or phase noise in the output of each type is reduced for a resonator of given Q value, thereby effecting perhaps significant cost reductions.

Figure 1:
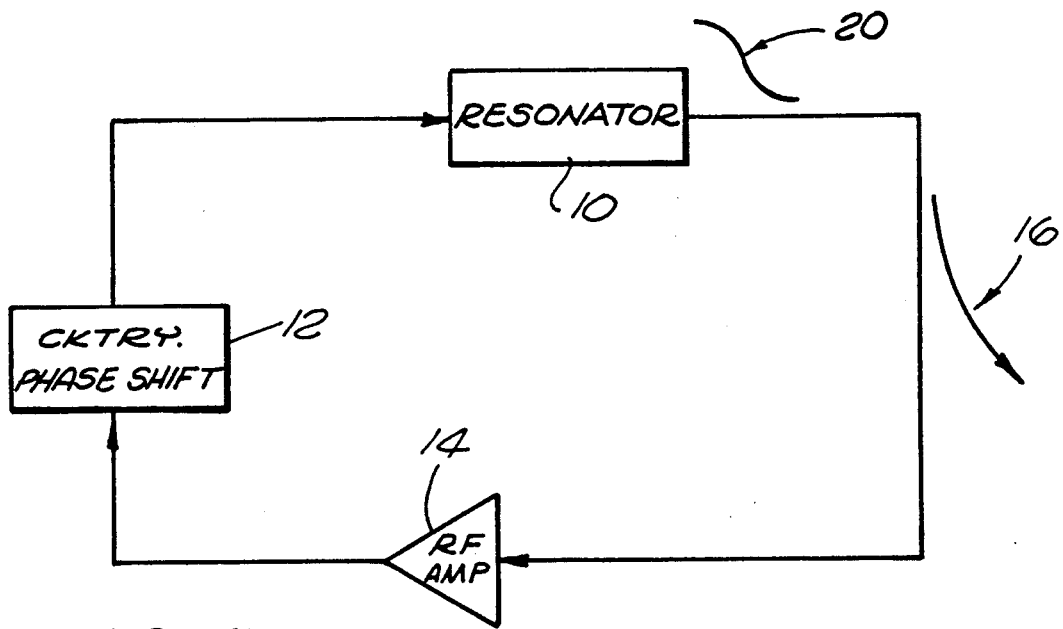
FIG. 1 is a block diagram of a conventional self-excited microwave oscillator of the prior art.
Figure 2:
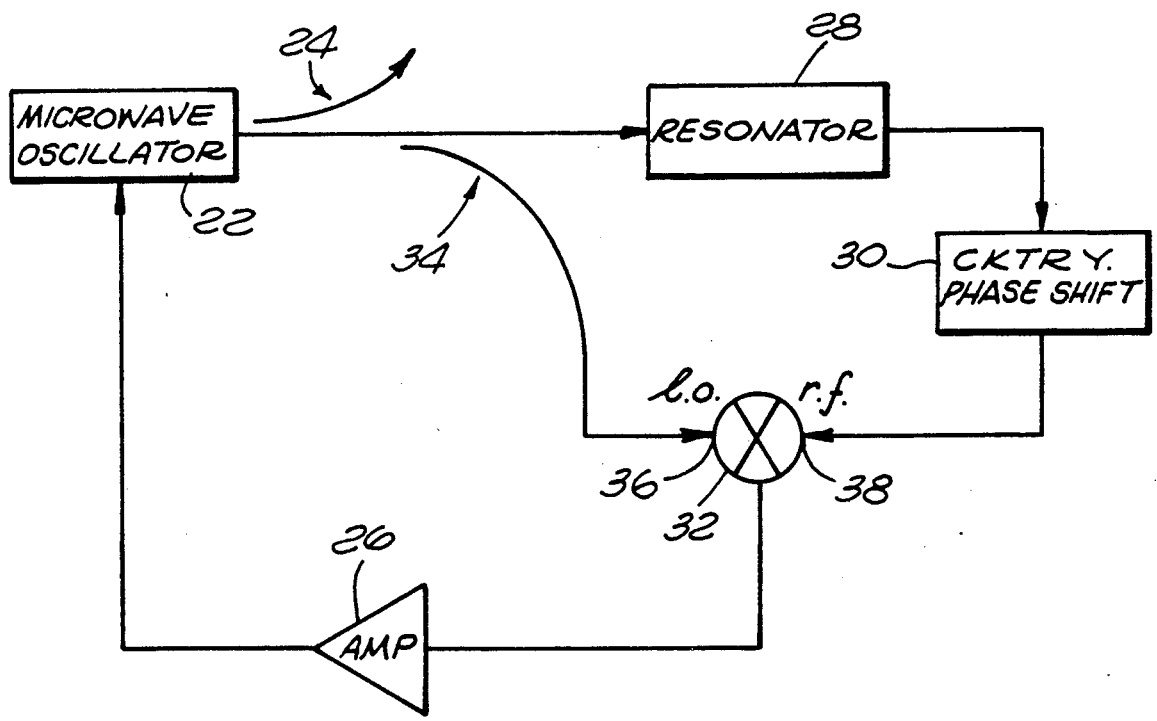
FIG. 2 is a block diagram of a conventional stabilized local oscillator (STALO) arrangement of the prior art that includes a double-balanced mixer type of phase detector.

FIGS. 1 and 2 are block diagrams of conventional microwave oscillators. FIG. 1 is directed to a conventional microwave oscillator of the self-excited type while FIG. 2 is directed to a STALO arrangement that includes a double-balanced mixer type of phase detector.

Oscillator With Direct Feedback—Theory

The "simple" oscillator with direct r.f. feedback of FIG. 1 includes a high-Q resonator 10, and associated interconnections 12 and an r.f. amplifier 14 in a feedback arrangement as shown. A coupler 16 is provided for extracting the oscillator's output signal.

The oscillation condition for the device of FIG. 1 requires that the phase shift around the complete feedback loop comprising the amplifier 14, the resonator 10 and the circuit interconnections 12 be a multiple of $2\pi$. Accordingly, any phase fluctuation in the microwave amplifier 14 must induce an opposite phase shift of equal magnitude in the resonator 10 for oscillation to continue. For slow phase fluctuations ($f << \nu/Q$), the characterisic phase slope of the resonator $\partial \phi / \partial \nu = 2Q/\nu$ implies a corresponding slow fluctuation in the frequency of the oscillator output signal. Accordingly, the power spectral density of phase fluctuations for the amplifier $S_\phi(f)|_{amp}$ produces oscillator output frequency noise as follows:

$$S_y(f)|_{out} = (2Q)^{-2} S_\phi(f)|_{amp} \quad (1)$$

or the mathematically equivalent output phase fluctuation:

$$S_\phi(f)|_{out} = (2Q)^{-2} (\nu/f)^2 S_\phi(f)|_{amp} \quad (2)$$

where f is he fluctuation frequency, $\nu$ is the microwave frequency, Q is the quality factor of the resonator 10 and y ($= \partial \nu/\nu$) is the fractional frequency deviation. The effect of phase fluctuation in the r.f. amplifier 14 upon oscillator output near the carrier frequency is illustrated by the curve 20 sketched above the resonator 10.

STALO—Theory

The STALO with double-balanced mixer type phase detector, as shown in FIG. 2, includes a tunable microwave oscillator 22 whose output is taken at a coupler 24. The oscillator 22 itself includes an amplifier a-d a relatively low-Q resonator. A low-noise baseband amulifier 26 provides a voltage signal for causing a counteracting frequency fluctuation in the output of the oscillator 22. Such corrective signal is derived by a feedback arrangement that includes a high-Q resonator 28, circuitry 30 for effecting a phase shift of $(\frac{1}{2} \pm 2n)\pi$ about the feedback loop as shown, and a mixer 32 that is arranged as a phase detector. The circuitry 30 is arranged to assure that the signals applied to the local oscillator and r.f. ports of the mixer 32 are nominally quadrature. The mixer 32 effectively measures the phase shift between the oscillator output (sampled through a coupler 34 that is in communication with the local oscillator port 36) and the output port of the resonator 28 which is in communication with the r.f. port 38 of the mixer 32. By to coupling the ports of the mixer 32, its output comprises a low frequency signal that reflects the time-varying phase shift across the resonator 28.

Frequency variations in the output of the noisy microwave oscillator 22 are cancelled by the above described feedback loop that detects phase shifts induced across the high-Q resonator 28 to generate corresponding correction voltages. In the limit of large loop gain, oscillation requires that the phases at the two input ports of the mixer 32 be in quadrature (mixer output "zero"). A STALO configuration is advantageous. The properties of the STALO feedback loop are relatively easy to control as the signal is mixed down to near zero frequency baseband. Accordingly, active filters with narrow bandwidths and sophisticated response shapes, located in the path of the baseband signal, that would not be appropriate at microwave frequencies may be employed in a STALO. Analysis of a conventional STALO as shown in FIG. 2 is identical to that for a self-excited oscillator when one substitutes mixer 32 noise $S_\phi(f)|_{mix}$ for $S_\phi(f)|_{amp}$.

The performance of a direct feedback oscillator with an amplifier having 1/f noise of $-120$ db/Hz ($S_\phi(f)|_{amp} = 10^{-12}/f$ radians$^2$/Hz) is $S_\phi(f)|_{out} = 10^{-12}(2Q)^{-2}(\nu^2/f^3)$.

While $-120$ db/Hz is the lowest noise figure that can be achieved with a microwave amplifier, it is not unreasonable to achieve $-135$ db/Hz with a microwave mixer.

Thus, a STALO employing a mixer 32 with 1/f noise of $-135$ db/Hz at 1 Hz will be 15 db quieter.

Improved Microwave Oscillator With Direct Feedback

Figure 3:
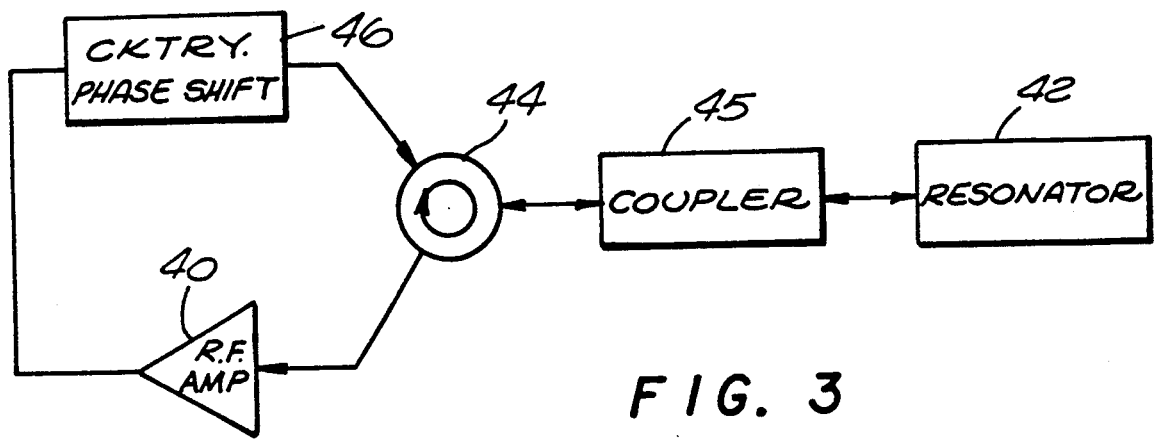
FIG. 3 is a block diagram of an improved self-excited microwave oscillator in accordance with the invention.

FIG. 3 is a block diagram of a microwave oscillator with direct r.f. feedback in accordance with the invention. As in the case of the corresponding microwave oscillator of the prior art (shown in FIG. 1), the oscillator of the invention includes an r.f. amplifier 40 and a high-Q resonator 42 in a feedback configuration. Unlike the microwave oscillator of FIG. 1, a circulator 44 is interposed between the resonator 42 and the r.f. amplifier 40 and a coupler 45 is provided adjacent the input port of the resonator 42. Circuitry 46 provides a phase shift equal to a mutiple of 2'' for oscillation within the feedback loop.

The coupler 45 is of a type for effecting slight over-coupling between the microwave circuitry and the resonator 42. Examples of appropriate couplers 45 for effecting the desired over-coupling of the resonator 45 include an appropriately designed iris at the end of a waveguide or a coaxial line with a small shorted end loop interior to the resonator. The size of the loop determines the degree of coupling. Both the design and the theory of operation of a coupler for effecting a predetermined degree of overcoupling are well known in the microwave art.

As discussed with reference to the prior art microwave oscillator excited by direct r.f. feedback, any slow phase shift in the feedback amplifier is converted into a frequency shift in the oscillator output to maintain constant phase shift around the feedback loop with the conversion constant depending upon the resonator Q.

The total signal returned to the circulator 44 from the coupler 45 is the superposition of a "reflected" constant signal (equal in magnitude to the input signal) and an "emitted" part (proportional to the instantaneous r.f. amplitude in the resonators.

While an improved STALO-type oscillator is provided by the invention that is based upon critical coupling where the net return signal on resonance is identically zero, the over-coupling of the resonator cavity 42 in the case of a self-excited oscillator assures that the signal emitted from the resonator 42 exceeds the reflected signal. Accordingly, the net signal return from the resonator 42 is not zero on resonance but has a small, constant value. By interposing the circulator 44 as shown, the oscillator of the invention, as opposed to that of FIG. 1, operates upon a non-zero signal that is the superposition of the two parts described above at resonance. In an arrangement as shown in FIG. 3, phase and frequency fluctuations in the output of the microwave oscillator are reduced in comparison with those of the prior art microwave oscillator of FIG. 1 when the gain of the r.f. amplifier 40 is the chosen to satisfy the oscillation condition at resonance.

Analysis of the Improved Direct R.F. Feedback Oscillator

Figure 4:
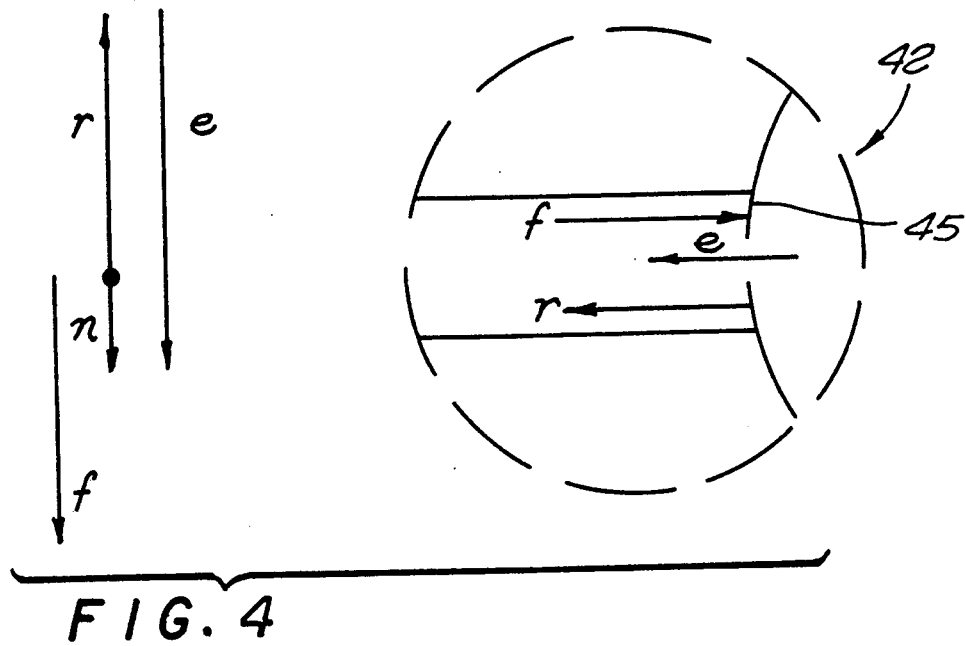
FIG. 4 is a phasor diagram of the interrelationships between forward, reflected, emitted and net signal amplitudes for a slightly over-coupled resonator at resonance.

FIG. 4 is a phasor diagram of the forward (f), reflected (r), emitted (e) and net (n) signal amplitudes for a slightly over-coupled resonator 42 at resonance (test frequency = resonator frequency) All of the indicated signals are measured at the effective plane of the weak coupling port 45.

The condition of oscillation at resonance requires that the gain and phase shift around the direct r.f. feedback loop must regenerate f from n. For the arrangement of FIG. 3, a net phase shift $2n\pi$ and a gain sufficient to overcome the signal amplitude reduction $|n/f|$ are required (Small losses due to transmissions through various circuit elements must also be "made up" by the amplifier 40 gain. However, such losses may be ignored for purposes of this analysis.)

Intrinsic and extrinsic Q's ($Q_i$ and $Q_e$) describe the effect of resonator and coupling losses and combine to form the loaded Q as follows:

$$1/Q_l = 1/Q_i + 1/Q_e \qquad (3)$$

The above defines the operational bandwidth of the resonator 42. It may readily be shown that the amplitude response of the resonator 42 to the forward signal (f) can be written:

$$\frac{|e|}{|f|} = \frac{2q}{q+1} \times \frac{1}{\sqrt{(1+(2Q_l\delta\nu/\nu_o)^2)}} \qquad (4)$$

where $q = Q_i/Q_e$ is a loading factor, $\nu_o$ is the resonance frequency and $\delta\nu$ is the frequency deviation from resonance. The phase of the resonator 42 response is given by:

$$\tan(\phi) = 2Q_l\delta\nu/\nu_o \qquad (5)$$

The above provides a slope at resonance of:

$$\frac{\partial\phi}{\partial\nu} = \frac{2Q_l}{\nu_o}. \qquad (6)$$

The gain of the amplifier 40 required for oscillation at resonance ($\delta\nu \approx 0$) may now be determined. In accordance with the arrangement of the microwave oscillator of FIG. 3, $r = -f$ and from the preceding equations:

$$e = f \times \frac{2q}{q+1}. \qquad (7)$$

The foregoing may be combined to give:

$$n = r + e = f \times \frac{q-1}{q+1} \qquad (8)$$

From the preceding, the gain required for oscillation is as follows:

$$G = \frac{|f|}{|n|} = \frac{q+1}{q-1} \qquad (9)$$

The over-coupled condition illustrated in FIG. 4 corresponds to q>1. Setting q=1 +δq, the gain for oscillation becomes:

$$G = 2/\delta + 1 \quad (10)$$

Figure 5:
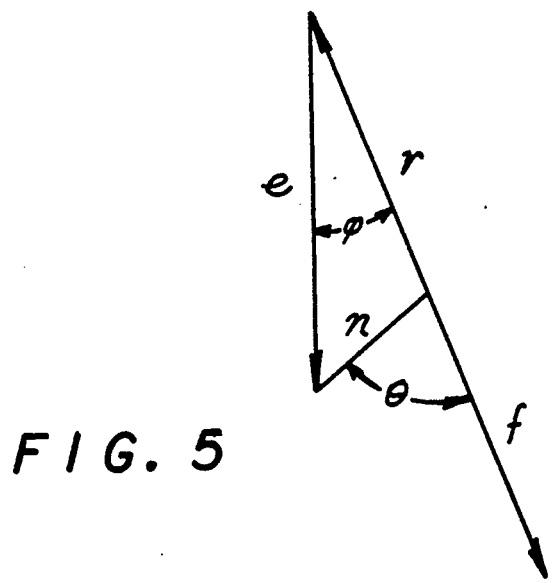
FIG. 5 is a phasor diagram of the effect of amplifier phase shift upon operation of a self-excited oscillator in accordance with the invention.

For the prior art microwave oscillator with direct r.f. feedback illustrated in FIG. 1, a small phase shift $\theta$ in the amplifier 14 produces a corresponding phase shift $-\theta$ across the resonator 10 with a resultant frequency shift given by the phase slope defined in Equation 6. The arrangement illustrated in FIG. 3 results in a reduced resonator 42 phase shift and, consequently, a reduced frequency shift for any given amplifier phase fluctuation. FIG. 5, discussed below, illustrates this effect.

FIG. 5 is a self-consistent phasor diagram that illustrates the effect of amplifier phase shift on the operation of the STALO oscillator in accordance with the invention. In the diagram, a slight amplifier phase shift is indicated by $\theta$. (The diagram of FIG. 5 is arbitrarily oriented so that the direction of e is consistent with that of FIG. 4.) Graphically solving n = e + r as shown, the effect of a rotation $\theta$ between n and f as required by the amplifier 40 results in an angle $\Phi$ between f and e that in turn determines frequency shift via Equation 6. Referring to FIG. 5, a straightforward evaluation of the indicated geometry shown gives:

$$\theta = \phi + \sin^{-1}(|r|/|n| \times \sin(\phi)) \quad (11)$$

which can be approximated in the limit of small angles to give:

$$\phi/\theta \approx \frac{1}{1 + |r|/|n|} \quad (12)$$

The foregoing approximation will hold to a high degree of accuracy because of the very small values of the phase fluctuations involved. Using Equation 9 and the identity r = -f, the above can be rewritten in terms of the gain of the amplifier 40 as follows:

$$\phi/\theta \approx \frac{1}{1 + G} \quad (13)$$

The factor $\phi/\theta$ represents the reduction in phase variation across the resonator 42 as compared to that across the amplifier 40. It also describes the improvement in performance due the arrangement of the microwave oscillator in accordance with the invention as shown in FIG. 3.

Combined with Equation 2, the phase noise performance of the oscillator of FIG. 3 is:

$$S_\phi(f)|_{out} = (\phi/\theta)^2 (2Q_l)^{-2}(\theta/f)^2 S_\phi(f)|_{amp} \quad (14)$$

For example, for G=10 (20 db of amplification), $\phi/\theta$ is 1/11 (22 db of noise reduction). If the amplifier 40 has noise of $-120$db/f/Hz ($S_\phi(f)|_{amp} = 10^{-12}/f$ radians²/Hz), oscillator performance will be $S_\phi(f)|_{out} = 0.8 \times 10^{-14}(2Q_l)^{-2}(\nu^2/f^3)$ which for a frequency of 10 GHz and $Q_l$ of $10^5$ gives $S_\phi(f)|_{out} = 2 \times 10^{-5}/f^3$ or $-47$ db/Hz at f=1 Hz offset frequency. For this same case, the above equations show that the degree of over-coupling required is $\delta q = 2/(G-1) = 2/9$ or $Q_i/Q_e = 1 + \delta q = 11/9$ and $$Q_l = \frac{1}{Q_e^{-1} + Q_i^{-1}} = Q_i \times \frac{1}{11/9 + 1} = 0.45 \times Q_i.$$

Figure 6:
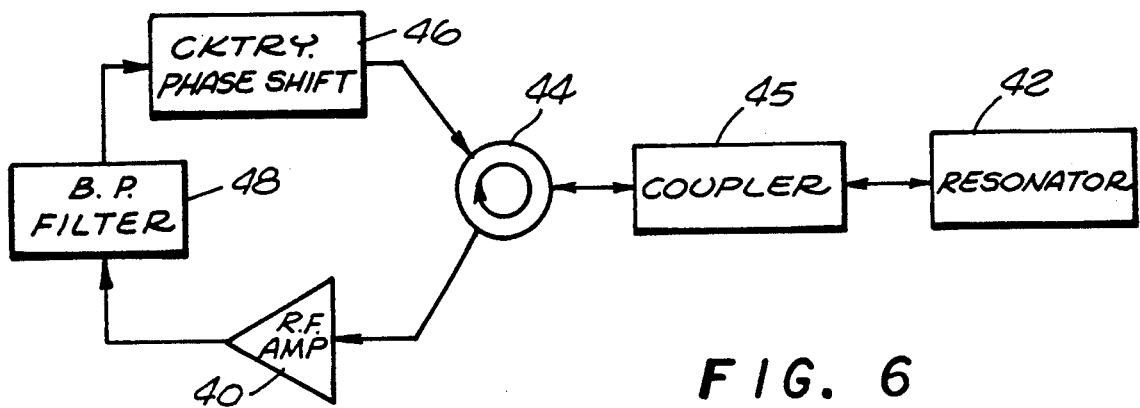
FIG. 6 is a block diagram of an alternative embodiment of a self-excited microwave oscillator in accordance with the invention.

FIG. 6 is a block diagram of an alternative embodiment of a self-excited microwave oscillator in accordance with the invention. The embodiment of this figure differs from that of FIG. 3 by providing a single stage bandpass filter 48 in the feedback loop for the purpose of preventing spurious oscillation modes independent of the frequency of the resonator 42.

For oscillation to occur in a direct r.f. feedback microwave oscillator, the reflected signal must exhibit a net phase shift of $\pi$ radians from the forward signal. The loop cannot oscillate at frequencies outside the passband of the stabilizing resonator 42 unless a phase shift is introduced by other circuit elements. The path length of the circuit of FIG. 3 alone is sufficient to add such a phase shift if the frequency is slightly varied. Thus, for a path length of $10\lambda$ (where $\lambda$ is the wavelength at the operating frequency $\nu_0$), a phase shift of $\pi$ radians will occur with a 5 percent frequency change. Furthermore, at such ±5 percent frequencies, the loop gain will be G (a large value) and not approximately unity as called for by the oscillator design. The introduction of a filter 48 reduces the gain as the frequency is varied away from $\nu_o$ to a value that is less than unity by the time the phase shift due to all sources reaches $\pi$ radians. Since each stage of a filter introduces a phase shift of approximately $\pi/2$ radians by the time substantial attenuation is achieved, a single stage filter must be employed.

The introduction of a single stage filter 48 reduces the phase margin for the rest of the circuit to approximately $\pi/2$ radians. Since a single stage filter attenuates relatively slowly as frequency is varied, a relatively narrow bandwidth is required. Employing the $10\lambda$ example cited above and assuming G = 10 (20 db), an attenuation of 20 db must be achieved by the time the circuit introduces a $\pi/2$ radian shift, a frequency variation of 2.5 percent. A bandwidth of approximately 0.25 percent is thus employed. The effect of such a filter 48 on the operation of the oscillator of FIG. 6 would be small for Q's of 10,000 or more.

Figure 7:
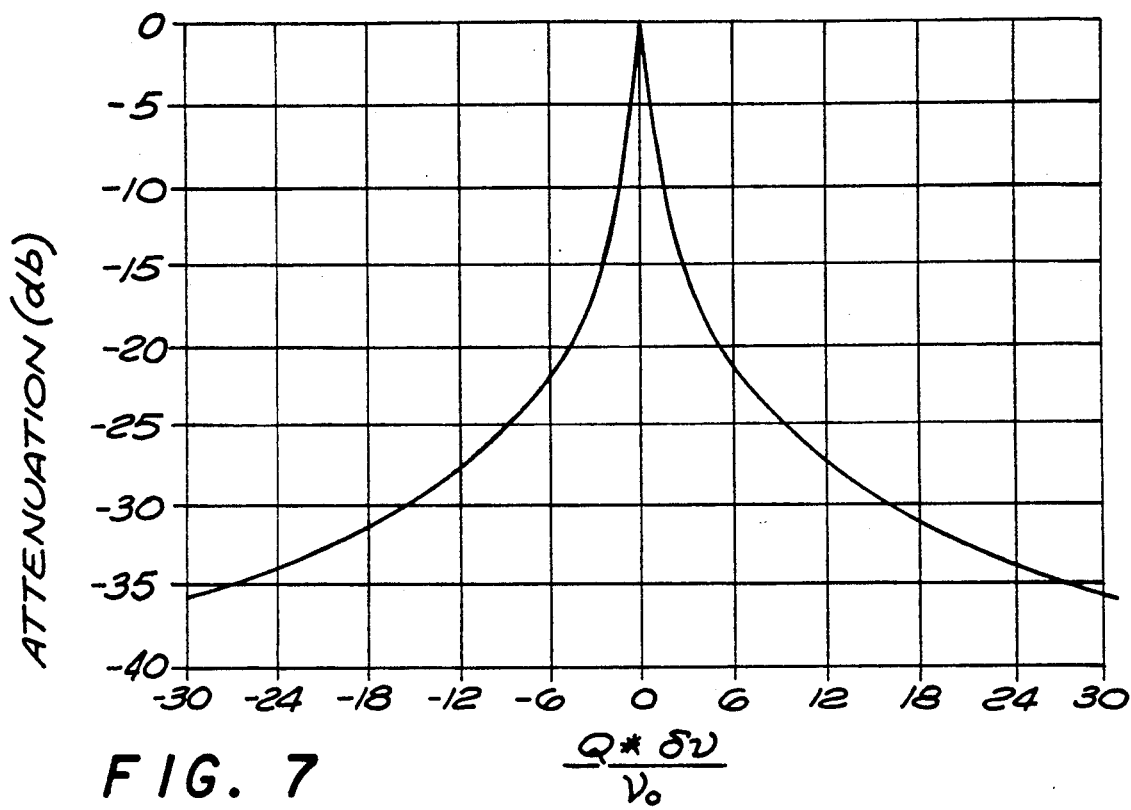
FIG. 7 is a graph of the amplitude response of a single stage bandpass filter for use in the embodiment of FIG. 6.
Figure 8:
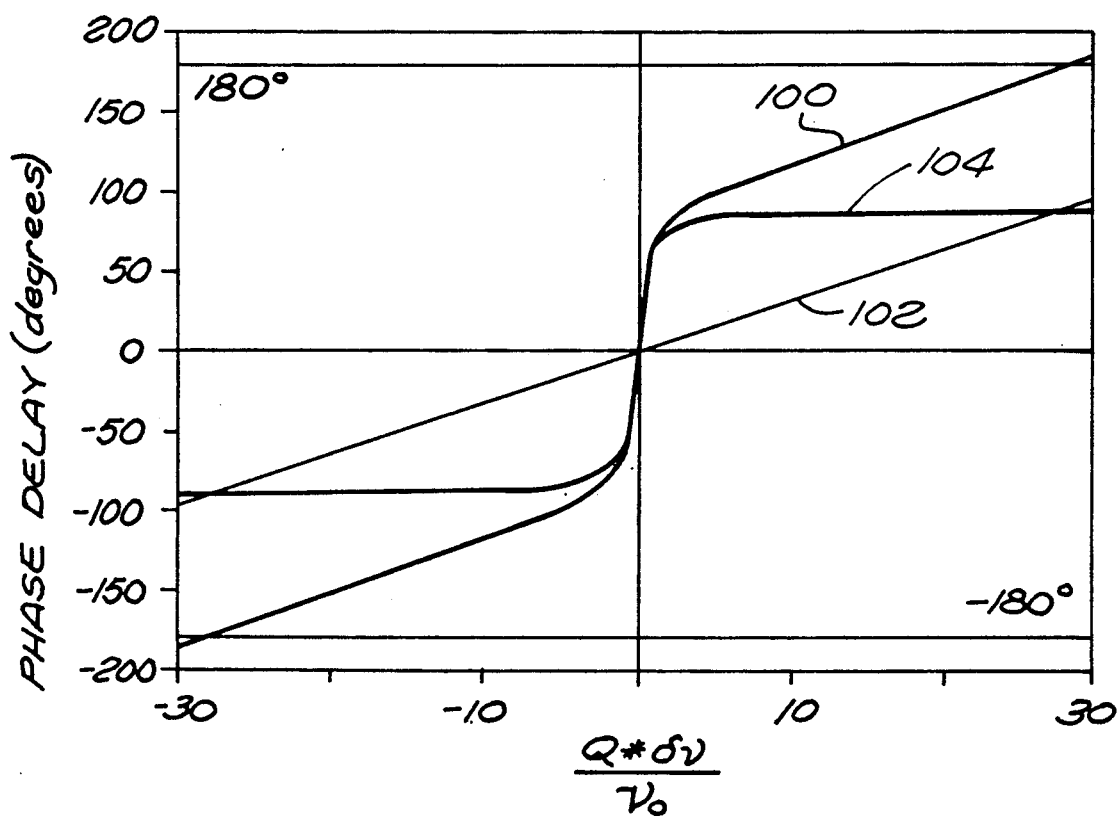
FIG. 8 is a graph of the phase response of a single stage bandpass filter for use in the embodiment of FIG. 6.

The expressions for phase shift and amplitude response for a single stage filter are identical to those presented in Equations 4 and 5 above. The shift due to a transmission line is given by $$\delta\phi = 2\pi(p/\lambda)(\nu\delta/\delta_o) \quad (15)$$

where p is the effective path length. FIGS. 7 and 8 are diagrams that illustrate the amplitude and phase response of a single stage filter 48 in an arrangement in accordance with FIG. 6. In FIG. 8, the linear curve 100 represents the dependency of phase shift upon frequency fluctuation for an oscillator in accordance with FIG. 6 and a nominal frequency of 8 GH₃ (Q=3000, pathlength=1 meter). This dependency is broken down into the linear relationship 102 of phase shift to path length and that due to the single stage bandpass filter 104. By comparing the two figures, it can be seen that the attenuation of the filter 48 is nearly 35 db by the time the total phase variation due to filter and transmission path losses reaches $\pi$ radians. While a relatively high (for a single-mode filter) Q of 3000 is presumed in FIGS. 7 and 8, it can be attained with low loss. It is clear that usable gain and consequent useable noise reduction of 20db–30db may be achieved by employing the modifications incorporated in the alternative embodiment of FIG. 6.

Improved STALO-type Microwave Oscillator

Figure 9:
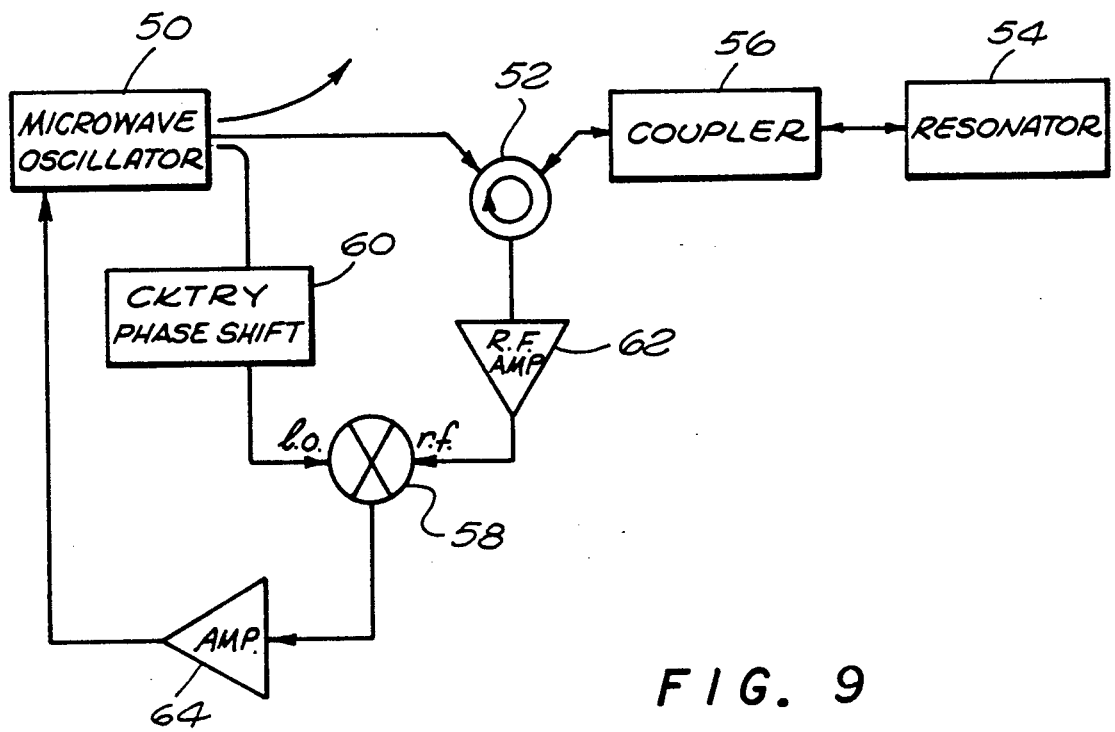
FIG. 9 is a block diagram of an improved STALO-type microwave oscillator in accordance with the invention.

FIG. 9 is a block diagram of an improved microwave oscillator of the STALO-type in accordance with the invention. A tunable microwave oscillator 50 is regulated by means of an arrangement based upon but incorporating significant variations from the prior art STALO oscillator of FIG. 2.

A three-port circulator 52 is interposed between the output of the oscillator 50 and a high-Q resonator 54. A coupler 56 is provided for assuring critical coupling of the resonator 54 to the rest of the circuitry.

As before, a mixer 58 is configured as a double-balanced phase detector. The local oscillator input to the mixer 58 is derived from the output of the oscillator 50 through circuit interconnections 60 which introduce a phase shift $\delta\phi$. The r.f. input to the mixer is received from the resonator 54 and through an r.f. amplifier 62 that is interposed between the circulator 52 and the mixer 58. The output of the modified feedback circuitry of the improved STALO-type oscillator of FIG. 7 is applied to an amplifier 64 as in FIG. 2 for providing the corrective signal to the tunable microwave oscillator 50.

Analysis of the Improved STALO Oscillator

By arranging the oscillator as shown in FIG. 9, a net signal n is derived from the high-Q resonator 54 which is the result of the superposition of the signals reflected by and emitted from the resonator cavity. The coupler 56 is designed so that the resonator 54 is critically coupled to the circuitry of the oscillator. Accordingly, $r=e$ and the net return signal n is zero.

Figure 10:
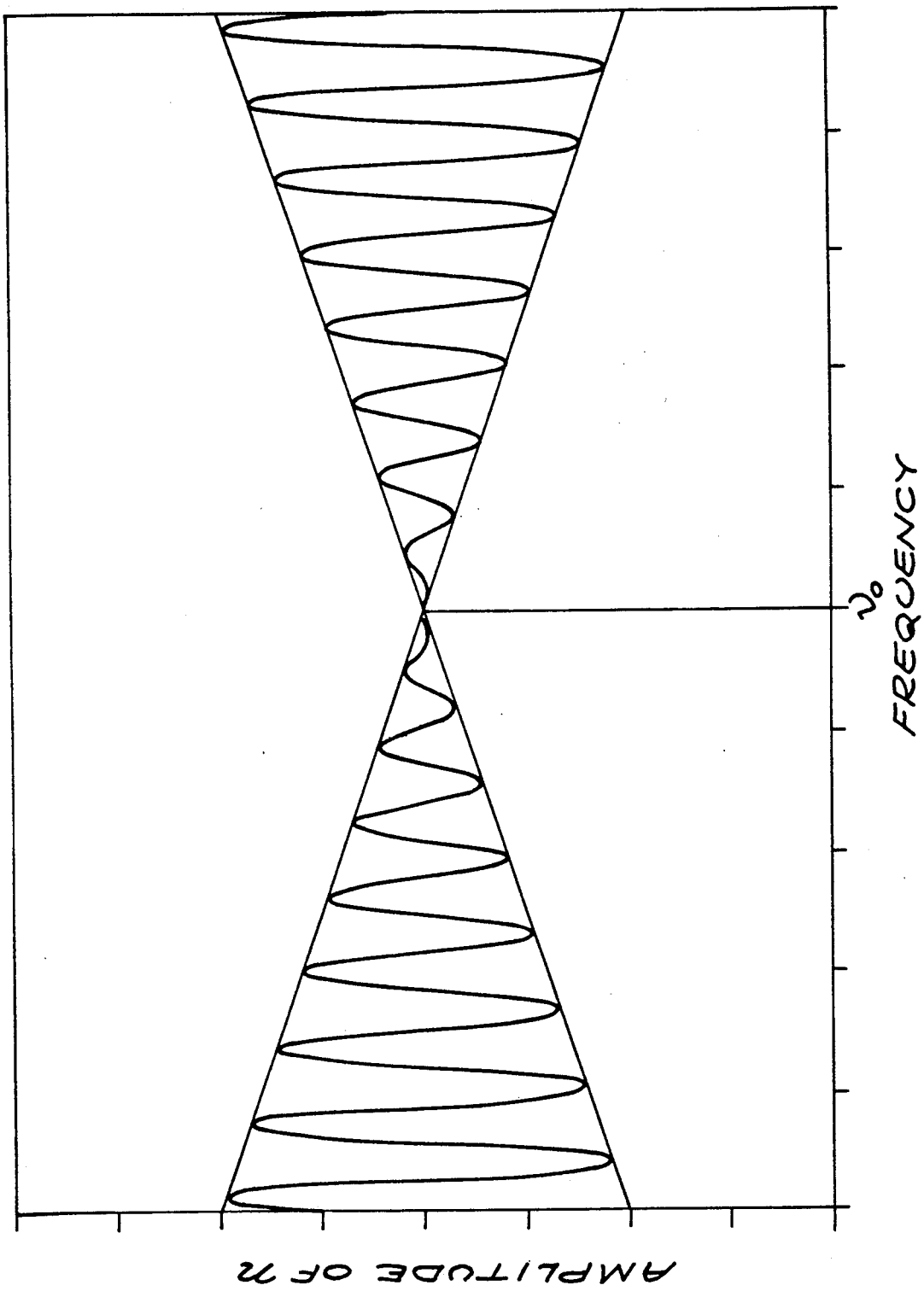
FIG. 10 is a graph of the r.f. envelope of the net returned signal for illustrating the effect of small errors in mixer frequency.

FIG. 10 is a graph of the r.f. envelope of the net returned signal n showing the effect of small errors in mixer 58 frequency. As mentioned earlier, in a STALO configuration phase fluctuations due to the active mixer 58 that induce corresponding phase fluctuations across the resonator 54 that produce in frequency fluctuations in the output of the oscillator 50. In FIG. 10, one can see that the amplitude of the return signal n goes through zero and it experiences a phase reversal on resonance when the in-phase signal on one side of the mixer 58 becomes out-of-phase on the other side of the mixer 58. As a result, a linear dependence of mixer output voltage on frequency error $\delta\nu$ exists for arbitrarily small frequency errors. The linear dependence in the output of the mixer 58 permits effective feedback. (The mixer 58, which functions as a phase detector, may be visualized as projecting the component of the signal at the r.f. port onto the phase of that at the local oscillator port.)

Due to the presence of the r.f. amplifier 62, the small (nominally zero) signal n returned from the resonator 54 is amplified before it enters the mixer 58. Two effects result from the incorporation of the amplifier 62 into the feedback arrangement. First, loop gain is increased by the amplifier 62. This effect can be compensated by the design of the baseband amplifier 64. Secondly, the amplifier 62 increases the sensitivity of the output of the mixer 58 to phase error in the resonator 54 as a consequence of its gain. A corresponding increase in the noise of the mixer 58 does not occur as the mixer noise is additive. The arrangement, including a three-port circulator 52, produces a signal input to the mixer 58 with a suppressed carrier. The suppressed carrier not only prevents amplifier noise from adding to mixer noise, it also permits the use of an amplilfier without saturating the mixer. Accordingly one can use all of the additional information content provided by the amplifier. The net effect of the modification of the conventional STALO configuration of the prior art to that of FIG. 9 is a reduction in the effective phase noise of the mixer 58 by the amount of the gain of the r.f. amplifier 62. This can produce a substantial improvement in oscillator performance.

A third beneficial effect resulting from modification of the conventional STALO oscillator centers upon the fact that, while r.f. amplifiers are somewhat more noisy than mixers (−120 db as opposed to −135 db at 1 Hz offset), the type of noise that is relevant to the arrangement of FIG. 9 is not "additive" but is rather "multiplicative". Additive noise is independent of the presence of any large signal whereas multiplicative noise transforms a large signal by slightly modifying its amplitude and phase. (Additive noise in good amplifiers is insignificant except at offset frequencies exceeding approximately 10kHz where the 1/f multiplicative noise is relatively small.)

Figure 11:
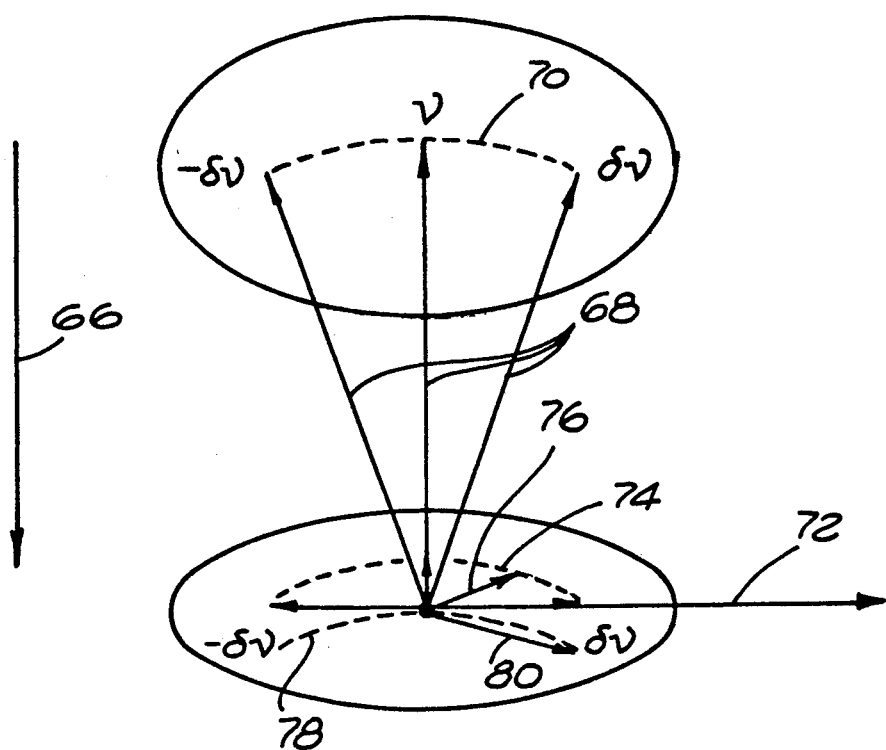
FIG. 11 is a phasor diagram that illustrates the effect of carrier suppression of the r.f. resonator upon frequency error in a STALO-type oscillator.
Figure 12:
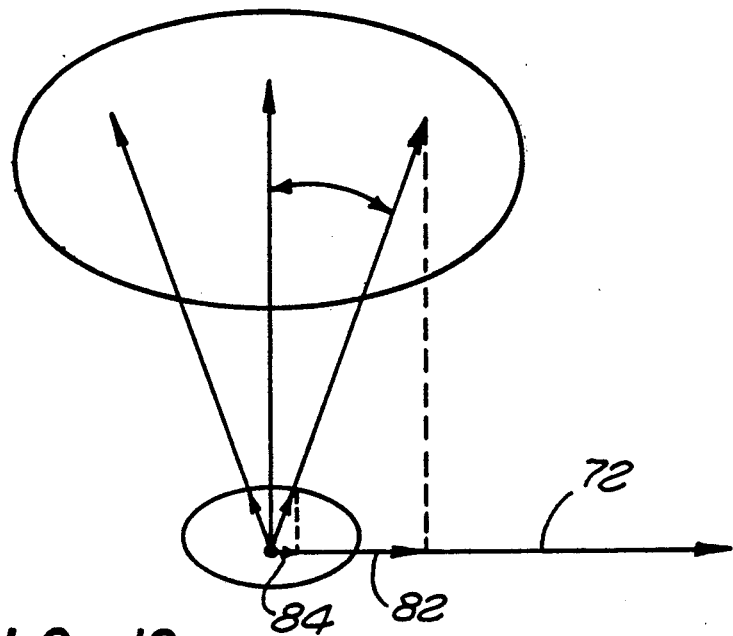
FIG. 12 is a phasor diagram that illustrates the effect of carrier suppression upon r.f. amplifier phase noise in a STALO-type oscillator in accordance with the invention.

The effects of carrier suppression in a STALO arrangement in accordance with the invention are demonstrated by the diagrams of FIGS. 11 and 12. FIG. 11 is a phasor diagram that demonstrates the increased sensitivity of the STALO feedback loop that is made possible by the generation of a net return signal with suppressed carrier for r.f. amplification prior to application to the mixer 58 configured as a phase detector. The diagram of FIG. 12 demonstrates the reduction in r.f. amplifier noise that results from the inputting of a signal with a suppressed carrier as opposed to the signal e emitted by the stabilizing resonator.

Turning now to FIG. 11, the phasor 68 corresponds to the signal e emitted from the high-Q resonator 10 of FIG. 1 and the arc 70 represents the locus of points through which the "tip" of the phasor 68 travels as the resonator output fluctuates between $\nu_o-\delta\nu$ through $\nu_o+\delta\nu$. As can be seen, the magnitude of e remains relatively large and does not vary greatly as the resonator is swept through the referenced frequency band. (It is well known in the microwave art that the arc 70 is a segment of a circle that is tangent, at its "bottom" to the abscissa of the graph, and passes through the origin.)

The phasor 66 represents the reflected signal r at the input port of the coupler 56. This signal does not vary as the phase and magnitude of e are varied. The reference signal at the local oscillator port of the mixer 58 is represented by the phasor 72. As mentioned earlier, the net return signal n, a superposition of the e and r signals ($n=e-r$) is applied to the r.f. amplifier 62 through the circulator 52. This net return signal is represented by the phasor 76 (slightly undercoupled case), the "tip" of which is swept through the locus of points denoted by the arc 74. (For critical coupling, wherein the r phasor 66 is equal in magnitude to the e phasor 68 at resonance, an n phasor 80 is swept through a locus defined by the segment 78. It is noted that n is zero for critical coupling at resonance $\nu_o$.)

As can be seen by comparing the arc 70 representing the locus of points defining the e signal phasors with either of the arcs 74 or 78 representing the loci of the n signal phasors, the carrier suppression effected by the STALO configuration of the invention significantly reduces the magnitude of the signal transmitting information about resonator phase or frequency deviation to the STALO feedback loop. More specifically the n signal of the improved STALO is considerably smaller than the e signal that is employed in the prior art STALO for comparison with the oscillator output. Furthermore, while the e signal remains large and changes only relatively slightly (on a percentage basis) in length as the resonator is swept through a range of frequencies, the net return signal n is not only much smaller (by the amount of the reflected signal r) than e but the magnitude of n changes dramatically in percentage terms in response to resonator frequency fluctuations. Such effects, in combination, significantly enhance the sensitivity of the feedback loop of the improved STALO of the invention to phase or frequency fluctuations in resonator output. The relatively small magnitude of the n signal (as opposed to e) permits magnification by means of the r.f. amplifier 62 without the risk of saturation of the mixer 58. Furthermore, the dramatic percentage changes in the magnitude of n that occur as the resonator is swept through a range of frequency fluctuations sensitizes the mixer 58 configured as a phase detector to such fluctuations with or without the further impetus provided by the aforesaid amplification of n.

FIG. 12 is a phasor diagram showing the effect of carrier suppression upon amplifier 62 phase noise. As before, the phasors 68 represent the signal e represent n=e−r, the net return signal (slightly overcoupled case). Amplifier phase noise acts like a phase shift. The amplifier noise that occurs as amplifier output is swept from $v_o - \delta v$ though $v_o + \delta v$ is represented by the magnitude of the component of e (hypothetical amplifier output without carrier suppression) or n (amplifier output with carrier suppression) that is in phase with the output signal (phasor 72) applied to the local oscillator port of the mixer 58. As can be seen from FIG. 12, the amplifier noise component 82 of the e signal is considerably greater than the noise component 84 of the suppressed carrier n signal. Thus the additive noise contributed by the incorporation of an r.f. amplifier 62 into the STALO feedback loop is minimized by the inputting of a suppressed carrier signal n to such amplifier.

R.f. amplifier noise, as illustrated, generates false signals due to the presence of the coherent carrier which are indistinguishable from those due to actual frequency variations. Thus, such amplifier noise is reduced in proportion to the degree of carrier suppression of the microwave signal at the input to the resonator cavity.

From the foregoing discussion, it can be appreciated that STALO-type configurations in accordance with the present invention take advantage of the substitution of a derived signal, n, for the signal emitted by the resonator, e. By operating upon n rather than e, the sensitivity of the feedback loop of the STALO configuration is enhanced with minimal added noise due to the incorporation of an r.f. amplifier. Oscillator phase noise is determined by a combination of mixer noise (positive relationship), amplifier gain (negative relationship), and amplifier noise (positive relationship), reduced by the degree of carrier suppression. For example, if mixing noise of −135 db/f/Hz were reduced by 25 db of amplifier gain to −160 db/f/Hz, and amplifier noise of −120 db/f/Hz were reduced by 40 db of carrier suppression to the same value, the combined noise of −157 db/f/Hz would determine oscillator performance of the oscillator. For a loaded Q of 10,000 (intrinsic Q=20,000) this would permit an oscillator phase noise of −43 db/f$^3$/Hz, a value superior to any room temperature microwave oscillator presently known. For room temperature and thermoelectrically-cooled sapphire resonators with Q's of $10^5$ and $10^6$ performance would be superior to that of any available source at −63 db/f$^3$/Hz and −83 db/f$^3$/Hz, respectively.

Figure 13:
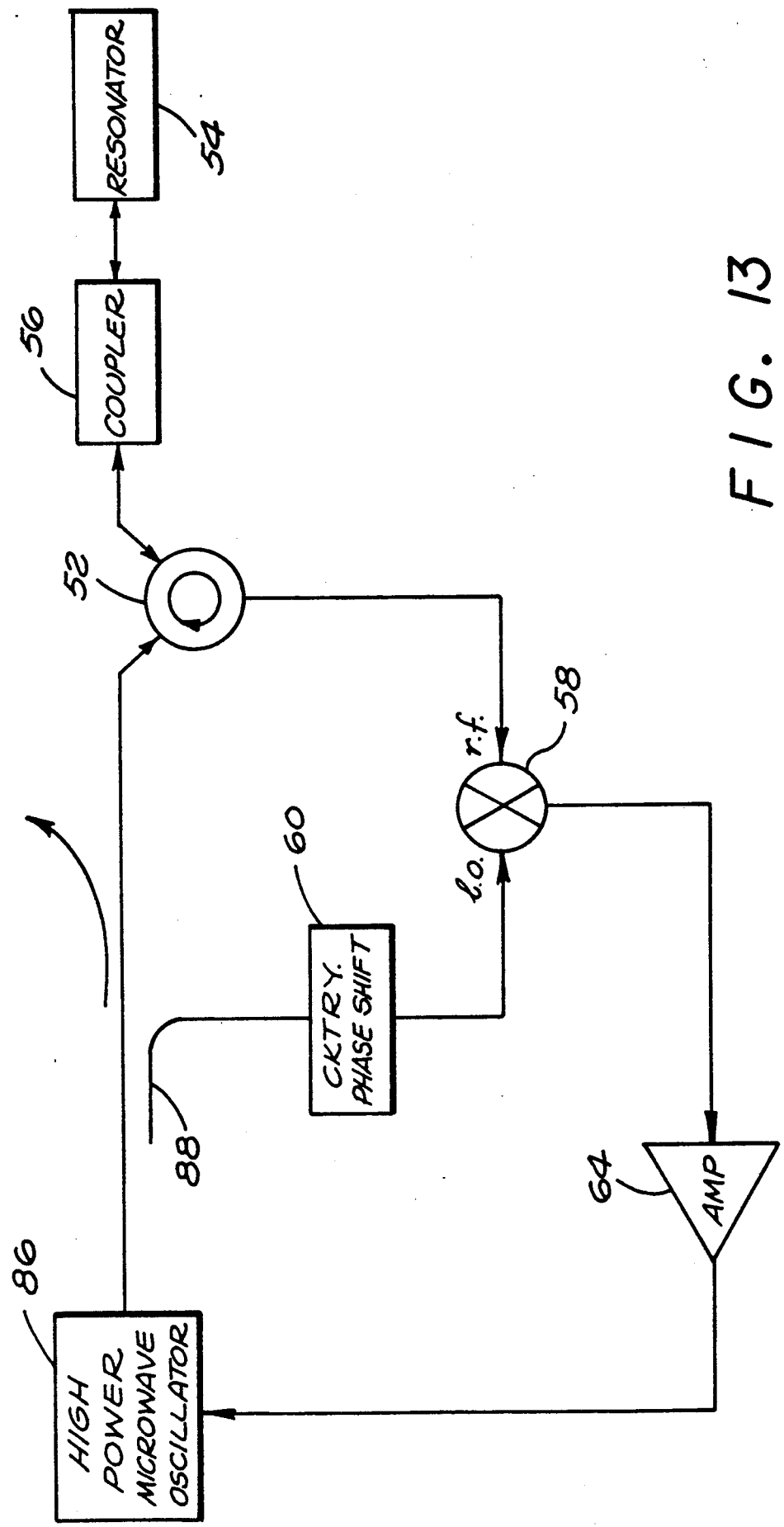
FIG. 13 is a block diagram of an alternative embodiment of a STALO-type microwave oscillator in accordance with the invention.

An alternative embodiment of an improved STALO-type microwave oscillator in accordance with the invention is illustrated in FIG. 13. This embodiment comprises a STALO-type configuration employing a high-power microwave oscillator 86 in a circuit that includes weak r.f. coupling 88 to the local oscillator input of the mixer 58 configured as a phase detector. (Components corresponding to those of the prior STALO-type embodiment of the invention are indicated by numerals corresponding to those of FIG. 9.) The embodiment of FIG. 13 differs from that of FIG. 9 insofar as an r.f. amplifier is not interposed between the circulator 52 and the r.f. port of the mixer 58. Rather, the enhanced sensitivity of the phase detector 58 is achieved by means of the relatively high power in the high-Q resonator 54. The configuration of FIG. 13 is simpler insofar as no r.f. amplifier is utilized in the feedback loop. Accordingly, added phase noise due to incomplete carrier suppression is avoided.

As mentioned above, suppression of the carrier at the r.f. port of the mixer 58 has only an incidental effect upon mixer sensitivity since the suppressed part of the signal is in quadrature with the reference signal at the local oscillator port. (The part of the signal that is due to frequency variations ±δv is in phase with the reference and so is detected in any case.) Suppression of the carrier at the r.f. port allows the power to the high-Q resonator 54 to be increased without saturating the mixer 58. The increased power results in an enhanced sensitivity of the mixer output voltage to frequency variations ±δv.

In addition to the increased power levels in the oscillator 86 and the resonator 54, the only difference from the STALO-type embodiment of the invention of FIG. 9 is an appropriately weaker coupling 88 to the local oscillator port of the mixer 58. Mixers typically saturate at signal levels of 20 milliwatts while frequency sources and resonators can operate at power levels of greater than one watt. The resultant increased sensitivity of up to 17 db reduces the consequences of mixer noise by the same factor. For a mixer with flicker noise of −135 db/Hz at a 1 Hz offset, effective noise can be reduced to −152 db/Hz.

Figure 14:
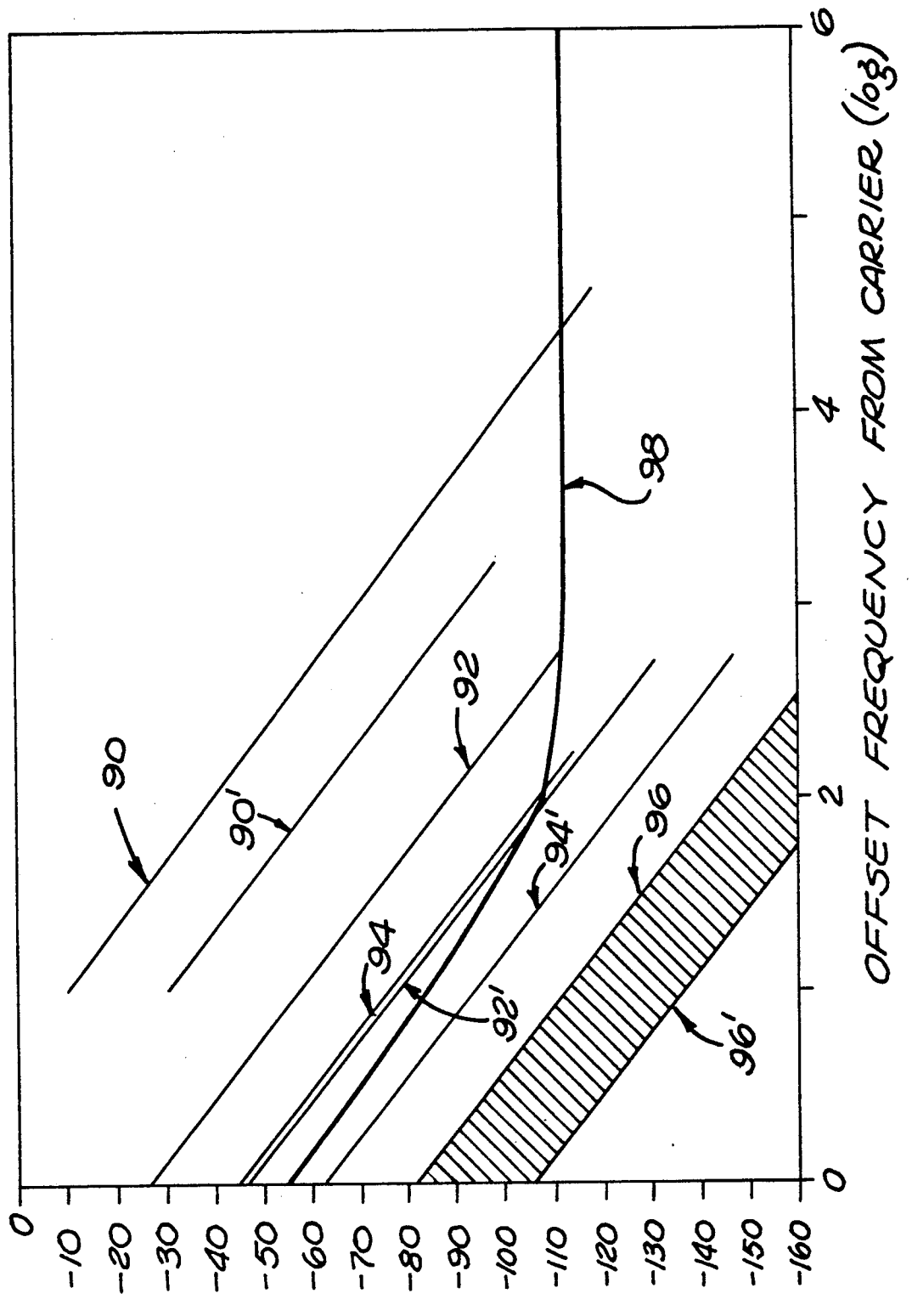
FIG. 14 is a graph that illustrates the improvement in phase noise performance of oscillator in accordance with the invention.

FIG. 14 is a graph that illustrates the improvement in phase noise performance achieved by means of the present invention. This graph, based upon calculations (with quality factors of $Q_i=2\times10^5$ at room temperature, $Q_1=2\times10^6$ at 17 K and $Q_i=3\times10^7$ at 77K), plots phase noise $S_\phi(f)$ versus offset frequency from carrier frequency f on a logarithmic scale. Lines 90 and 90′ denote the noise figures for a microwave oscillator with direct feedback (X-band DRO resonator) in accordance with the prior art and with the invention, respectively. As can be seen, an approximately 20 db improvement in noise performance is realized when one substitutes the microwave oscillator of FIGS. 3 or 6 for that of the prior art device of FIG. 1. The improvement realized when a sapphire resonator is employed in a direct feedback microwave oscillator is illustrated by contrasting FIGS. 92 and 92″, respectively. Again, an approximately 20 db improvement is observed.

The improvement in the performance of a STALO-type device (sapphire resonator) incorporating the invention over that of the prior art device of FIG. 2 is illustrated by contrasting the curves 94 and 94'. The contrast between the performance of the prior art STALO oscillator and that of the invention with a cryogenic (170K to 77K) setup is illustrated by comparison of the curves 96 and 96'. The multiplied 5 MHz crystal oscillator that represents the best noise performance available in accordance with the prior art is shown by the curve 98.

Thus, it can be seen that the microwave oscillator configurations of the present invention that employ microwave amplification with a suppressed r.f. carrier enable one to achieve lower phase noise than can be attained by the prior art without the inherent diseconomies of cryogenic operation. Accordingly, by employing the teachings of these inventions, one may attain superior oscillator performance without the currently recognized economic penalties associated with extremely high-Q resonators, cryogenic operation and the like.

While this invention has been described with reference to its presently preferred embodiment, it is not limited thereto. Rather, this invention is limited only insofar as defined by the following set of claims and includes within its scope all equivalents thereof.

What is claimed is:

1. In a method for reducing noise in the output of a tunable microwave oscillator of the type that includes a feedback arrangement for providing a corrective signal, said feedback arrangement including a resonator for receiving the output of said oscillator and an active phase detector for detecting fluctuations in said output by comparing said output with the signal emitted by said resonator, the improvement comprising the step of suppressing the carrier of said signal emitted by said resonator prior to applying said suppressed carrier signal to said phase detector.

2. A method as defined in claim 1 additionally including the step of amplifying said suppressed carrier signal prior to applying it to said phase detector.

3. A method as defined in claim 2 wherein the step of suppressing said carrier is further characterized by the steps of:
   a) reflecting said output at the input port of said resonator; and then
   b) superimposing said emitted and reflected signals.

4. A method as defined in claim 3 further characterized in that:
   a) said phase detector is a mixer;
   b) said output is applied to the local oscillator port of said mixer; and
   c) said suppressed carrier signal is applied to the r.f. port of said mixer.

5. A method as defined in claim 3 further characterized in that a three port circulator is interposed between the output of said oscillator and said resonator.

6. A method as defined in claim 5 wherein one port of said circulator is in communication with the input port of said resonator.

7. A method as defined in claim 6 further characterized in that an r.f. amplifier is coupled to a second port of said circulator and to said mixer.

8. A method as defined in claim 7 wherein a third port of said circulator receives the output of said oscillator.

9. A method as defined claim 8 further including the step of critically coupling said resonator.

10. A method as defined in claim 8 further including the step of over-coupling said resonator.

11. In apparatus for reducing noise in the output of a tunable microwave oscillator of the type that includes a feedback arrangement for providing a corrective signal, said feedback arrangement including a resonator for receiving the output of said oscillator and an active phase detector for detecting fluctuations in said output by comparing said output with the signal emitted by said resonator, the improvement comprising:
   a) means for suppressing the carrier of said signal emitted by said resonator; and
   b) said means is located between said resonator and said phase detector.

12. Apparatus as defined in claim 11 further including:
   a) means for amplifying said suppressed carrier signal; and
   b) said last-named means is located between said resonator and said phase detector.

13. Apparatus as defined in claim 12 wherein said means for amplifying is an r.f. amplifier.

14. Apparatus as defined in claim 13 wherein said means for suppressing said carrier further comprises:
   a) a circulator having at least three ports; and
   b) said three ports of said circulator are in communication with the output port of said oscillator, the input port of said resonator and the input of said amplifier.

15. Apparatus as defined in claim 14 wherein said phase detector further includes:
   a) a mixer; and
   b) said mixer is arranged so that said output is applied to the local oscillator port and the output of said amplifier is applied to the e r.f. port.

16. Apparatus as defined in claim 15 further including means for over-coupling said resonator.

17. Apparatus as defined in claim 15 further including means for critically coupling said resonator.

18. In a method for reducing noise in the output of a microwave oscillator of the type that includes a resonator and an r.f. amplifier in a feedback arrangement, the improvement comprising the steps of:
   a) suppressing the carrier of the signal emitted by said resonator; and then
   b) amplifying said suppressed carrier signal so that oscillation is achieved at resonance.

19. A method as defined in claim 18 wherein the step of suppressing said carrier further includes the steps of:
   a) reflecting the output of said amplifier at the input port of said resonator; and then
   b) superposing said reflected and emitted signals to form a net return signal with suppressed carrier.

20. A method as defined in claim 19 further including the step of filtering the output of said amplifier.

21. A method as defined in claim 20 wherein the step of filtering further comprises the step of locating a single stage bandpass filter for receiving the output of said amplifier.

22. A method as defined in claim 19 wherein the step of suppressing said carrier further includes the steps of:
   a) interposing a three-port circulator between said amplifier and said resonator; and then
   b) arranging said circulator so that one port receives the output of said amplifier, one port is in communication with the input port of said resonator and one port is in communication with the input to said amplifier.

23. A method as defined in claim 22 further including the step of over-coupling said resonator.

24. In an apparatus for reducing noise in the output of a microwave oscillator of the type that includes a resonator and an r.f. amplifier in a feedback arrangement, the improvement comprising, in combination:
   a) means for suppressing the carrier of the signal emitted by said resonator; and
   b) means for amplifying said suppressed carrier signal so that oscillation is achieved at resonance.

25. Apparatus as defined in claim 24 wherein said means for suppressing further includes:
   a) means for reflecting the output of said amplifier at the input port of said resonator; and
   b) means for superposing said reflected and emitted signals to form a net return signal with suppressed carrier.

26. Apparatus as defined in claim 25 further including means for filtering the output of said amplifier.

27. Apparatus as defined in claim 26 wherein said means for filtering is a single stage bandpass filter.

28. Apparatus as defined in claim 25 further including:
   a) a three-port circulator; and
   b) said circulator is arranged so that one port receives the output of said amplifier, one port is in communication with the input port of said resonator and one port is in communication with the input to said amplifier.

29. Apparatus as defined in claim 28 further including means for over-coupling said resonator.

* * * * *